(12) United States Patent
Otsuka et al.

(10) Patent No.: US 7,804,111 B2
(45) Date of Patent: Sep. 28, 2010

(54) SEMICONDUCTOR DEVICE AND METHOD FOR ADJUSTING CHARACTERISTICS THEREOF

(75) Inventors: Kanji Otsuka, Higashiyamato (JP); Munekazu Takano, Hino (JP); Fumio Mizuno, Hino (JP); Saburo Yokokura, Hino (JP); Tsuneo Ito, Ome (JP); Yuko Tanba, Ome (JP); Yutaka Akiyama, Hachioji (JP)

(73) Assignee: Tama-TLO Ltd., Tokyo (JP)

( * ) Notice: Subject to any disclaimer, the term of this patent is extended or adjusted under 35 U.S.C. 154(b) by 154 days.

(21) Appl. No.: 12/083,573

(22) PCT Filed: Oct. 10, 2006

(86) PCT No.: PCT/JP2006/320207

§ 371 (c)(1), (2), (4) Date: Apr. 15, 2008

(87) PCT Pub. No.: WO2007/046268

PCT Pub. Date: Apr. 26, 2007

(65) Prior Publication Data

US 2009/0108955 A1 Apr. 30, 2009

(30) Foreign Application Priority Data

Oct. 18, 2005 (JP) .............................. 2005-302693

(51) Int. Cl.
*H01L 29/94* (2006.01)

(52) U.S. Cl. ........................ 257/206; 257/208; 257/532; 257/E23.144

(58) Field of Classification Search ........... 257/E29.232
See application file for complete search history.

(56) References Cited

U.S. PATENT DOCUMENTS

2002/0021159 A1 2/2002 Takahashi (Continued)

FOREIGN PATENT DOCUMENTS

JP 2001-111408 4/2001

(Continued)

OTHER PUBLICATIONS

International Search Report issued Nov. 7, 2006 in the International (PCT) Application of which the present application is the U.S. National Stage.

(Continued)

*Primary Examiner*—Stephen W Smoot
(74) *Attorney, Agent, or Firm*—Wenderoth, Lind & Ponack, L.L.P.

(57) ABSTRACT

The object of the invention is to provide a semiconductor device including signal-transmission interconnections preferable for transmitting high frequency signal and capability to adjust characteristics of the above signal-transmission interconnections. A semiconductor device according to the present invention consists of a signal-transmission interconnection 20 for transmission of signals, a MOS capacitance element 10 having a gate electrode connected to the signal-transmission interconnection 20, a first voltage-applying interconnection 30 connected to a source and a drain of the MOS capacitance element 10 and applying a voltage to the source and the drain of the MOS capacitance element 10, a second voltage-applying interconnection 40 connected to a well of the MOS capacitance element 10, and applying a voltage to the well of said first MOS capacitance element 10. Jitters occurring in the signal-transmission interconnection 20 can be adjusted by adjusting each of voltages of the first voltage-applying interconnection 30 and the second voltage-applying interconnection 40.

18 Claims, 12 Drawing Sheets

U.S. PATENT DOCUMENTS

2004/0263269 A1 * 12/2004 Takamatsu .............. 331/108 C

FOREIGN PATENT DOCUMENTS

| JP | 2002-124858 | 4/2002 |
| JP | 2002-152011 | 5/2002 |
| JP | 2005-27005 | 1/2005 |

OTHER PUBLICATIONS

Ehsan Afshari et al., "*Nonlinear Transmission Lines for Pulse Shaping in Silicon*", IEEE Journal of Solid State Circuits, vol. 40, No. 3, Mar. 2005, pp. 744-752.

* cited by examiner

FIG.1
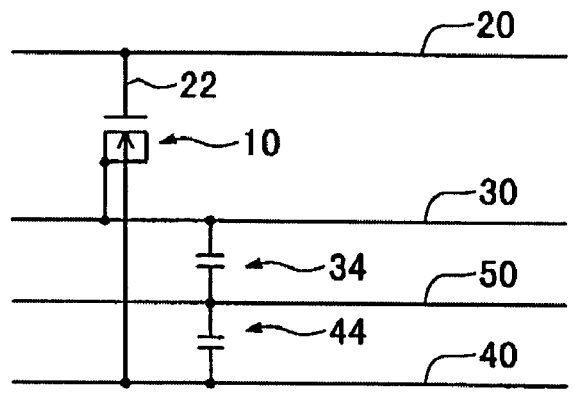
FIG.2A
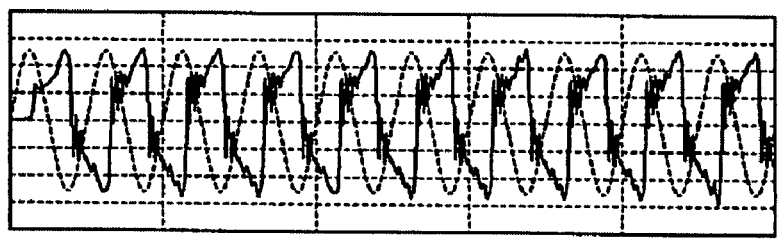 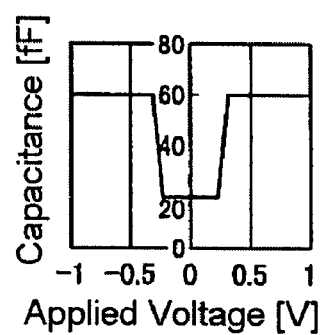
FIG.2B
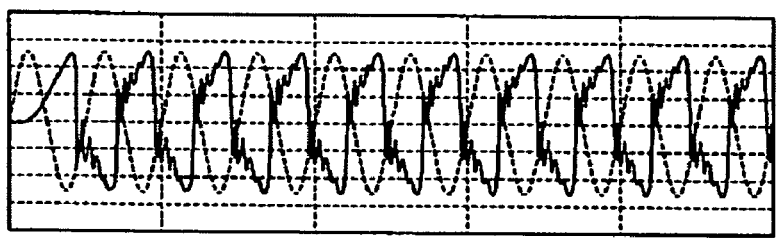 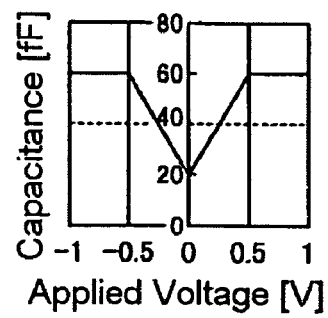

*FIG.22A*  *FIG.22B*
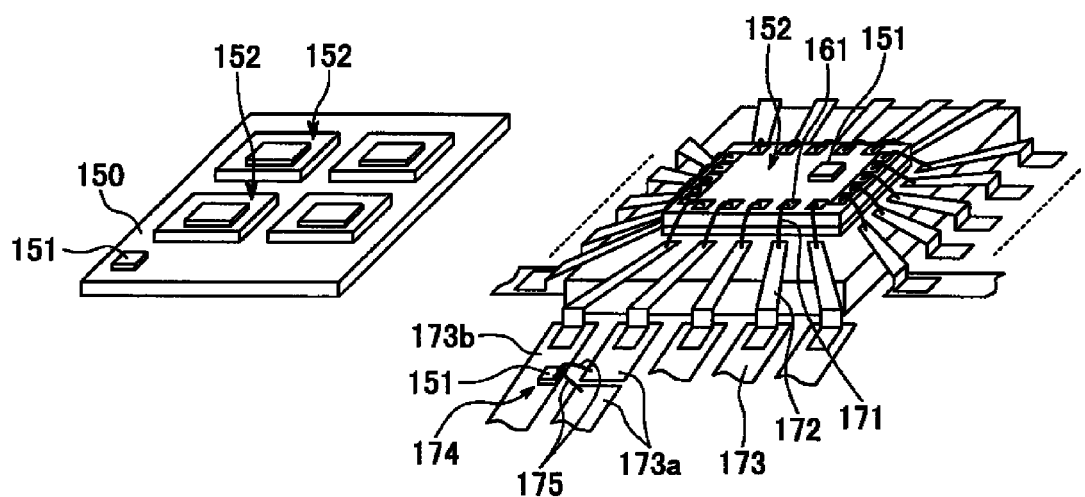
*FIG.23*
*Prior Art*
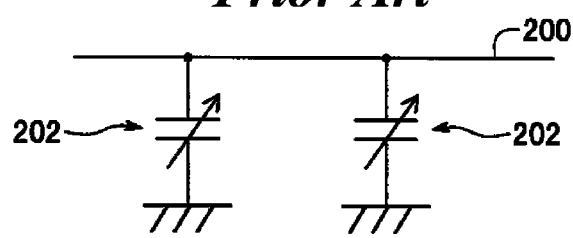

SEMICONDUCTOR DEVICE AND METHOD FOR ADJUSTING CHARACTERISTICS THEREOF

BACKGROUND OF THE INVENTION

I. Technical Field

The present invention relates to a semiconductor device and a method for adjusting characteristics thereof, especially, the present invention relates to a semiconductor device including signal-transmission interconnections preferable for transmitting high frequency signals and the capability to adjust characteristics of the above signal-transmission interconnections, and a method for adjusting characteristics of the semiconductor device.

II. Description of Related Art

Recently, the operations speed of semiconductor devices has increased, in other words, clock frequency thereof has been increased. Since mutual time intervals between high logic signals are shortened due to higher clock frequency, transmitting signals cannot be detected accurately in the case where the rising edge of the clock signal becomes slower. Therefore, a technology that makes rising edges of the clock signal for transmitting signals sharper becomes necessary.

FIG. 23 is a view of a circuit illustrating one conventional technology that makes rising edges of clock signal sharper during transmission of signals. The above technology has a configuration that a plurality of variable capacitance elements 202 are connected to a signal-transmission interconnection 200. At the early stage of the clock rising edge in the signal-transmission interconnection 200, voltage rising is restrained by storing enough charge in the variable capacitance element 202. Subsequently, after enough charge is stored in the variable capacitance element 202, the effect of restraining voltage rising thereof disappears, and then the voltage rises rapidly. As explained above, including the variable capacitance element 202, makes the rising edge of clock signals sharper in the signal-transmission interconnection 200.

In addition, in the signal-transmission interconnection 200, since the charge is released from the variable capacitance element 202 at an early stage of the clock falling edge, voltage dropping thereof is restrained. Subsequently, after enough charge is released from the variable capacitance element 202, the effect of restraining voltage rising thereof disappears, and then the voltage drops rapidly. As explained above, including the variable capacitance element 202 makes the falling edge of clock signals sharper in the signal-transmission interconnection 200 (for example, refer to IEEE JOURNAL OF SOLID-STATE CIRCUITS, VOL. 40 No. 3 MARCH 2005 P744-P752 (FIG. 6))

Characteristics of signal-transmission interconnections in semiconductor device (for example, jitter amplitude) include fluctuation caused by production lines thereof. In the case where the fluctuation is large, it is possible that signals cannot be transmitted accurately at higher frequency. Therefore, a technology for adjusting characteristics of signal-transmission interconnections becomes necessary after the production.

SUMMARY OF THE INVENTION

The present invention has been conceived considering the above-mentioned situations, and the object of the invention is to provide a semiconductor device including signal-transmission interconnections preferable for transmitting high frequency signals and the capability to adjust characteristics of the above signal-transmission interconnections, and a method for adjusting characteristics of the semiconductor device.

To solve the above problem, a semiconductor device of the present invention includes signal-transmission interconnections, MOS capacitance elements having a gate electrode connected to the above signal-transmission interconnections, a first voltage-applying interconnection connected to a source and a drain of the above MOS capacitance element for applying a voltage to the source and the drain, and a second voltage-applying interconnection connected to a well of the MOS capacitance element for applying voltage to the well.

The semiconductor device of the present invention can include a first capacitance element connecting the ground interconnection to the first voltage-applying interconnection, and a second capacitance element connecting the ground interconnection to the second voltage-applying interconnection. With the above configuration, the voltage variation in the first and the second voltage-applying interconnections for applying voltage caused by charging into or discharging from the above MOS capacitance element can be restrained.

The above-mentioned first and second capacitance elements can be MOS capacitance elements, respectively, and can be diodes including P-type and N-type diffusion layers. In addition, the first and second capacitance elements can consist of a first interconnection layer, an interlayer insulating film formed on the first interconnection layer, and a second conductive layer formed on the interlayer insulating film.

A semiconductor device according to the present invention includes signal-transmission interconnections for transmitting signals, n-type and p-type MOS capacitance elements having gate electrodes connected to the above signal-transmission interconnection, a first voltage-applying interconnection connected to the source and the drain of the n-type MOS capacitance element for applying a voltage to the source and the drain, a second voltage-applying interconnection connected to the well of the p-type MOS capacitance element for applying a voltage to the well, a third voltage-applying interconnection connected to the source and the drain of the p-type MOS capacitance element for applying a voltage to the source and the drain, and a fourth voltage-applying interconnection connected to the well of the n-type MOS capacitance element for applying voltage to the well.

The above-mentioned second voltage-applying interconnection can be replaced by a ground interconnection. In the above case, a first capacitance element for connecting the above second voltage-applying interconnection to the above first voltage-applying interconnection, a second capacitance element for connecting the above second voltage-applying interconnection to the above third voltage-applying interconnection, and a third capacitance element for connecting the above second voltage-applying interconnection to the above fourth voltage-applying interconnection can be included.

A semiconductor device according to the present invention includes a signal-transmission interconnection for transmitting signals, a MOS capacitance element having a gate electrode connected to the above signal-transmission interconnection, and a voltage-applying interconnection connected to a source, drain, and a well of the above MOS capacitance element for applying a voltage to the source, the drain, and the well thereof.

A semiconductor device according to the present invention includes a signal-transmission interconnection for transmitting signals, first and second MOS capacitance elements having gate electrodes connected at different places to each other along the above signal-transmission interconnection in the line-length direction, a first voltage-applying interconnection connected to a source and a drain of the above first MOS capacitance element for applying a voltage to the source and the drain, and a second voltage-applying interconnection connected to a well of the above first MOS capacitance element for applying a voltage to the well, a third voltage-applying interconnection connected to a source and a drain of the above second MOS capacitance element for applying a voltage to the source and the drain, and a fourth voltage-applying interconnection connected to a well of the above second MOS capacitance element for applying a voltage to the well.

A semiconductor device according to the present invention includes a signal transmission interconnection for transmitting signals, diode-type capacitance element formed by junction of a first conductive-type impurity region and a second conductive-type impurity region wherein the first conductive-type impurity region is connected to the signal transmission interconnection, and a voltage-applying interconnection connected to the second conductive-type impurity region of the diode-type capacitance so as to apply a voltage to the second conductive-type impurity region.

In each of the afore-mentioned semiconductor devices, the signal-transmission interconnection preferably transmits digital signals. In addition, a voltage limiting circuit for limiting the amplitude of the above signal transmitted by the above signal transmission interconnection can be further included. The above limiting circuit is preferable to be able to change the limiting amplitude value.

A semiconductor device according to the present invention includes a first signal-transmission interconnection for transmitting a first signal, a second signal-transmission interconnection for transmitting a second signal which is an inverted signal of the first signal, a first MOS capacitance element having a gate electrode connected to the above first signal-transmission interconnection, a second MOS capacitance element having a gate electrode connected to the above second signal-transmission interconnection, a first voltage-applying interconnection connected to a source and a drain of the above first MOS capacitance element and connected to a source and a drain of the above second MOS capacitance element so as to apply voltages to the above sources and drains, and a second voltage-applying interconnection connected to a well of the above first MOS capacitance element and connected to a well of the above second MOS capacitance element so as to apply voltages to the above wells.

Another embodiment of the present invention is a method for adjusting characteristics of a semiconductor device including a signal-transmission interconnection for transmitting a signal, a MOS capacitance element having a gate electrode connected to the above signal-transmission interconnection, a first voltage-applying interconnection connected to a source and a drain of the above MOS capacitance element so as to apply a voltage to the above source and drain, and a second voltage-applying interconnection connected to a well of the above MOS capacitance element so as to apply voltages to the above well, and the invention is configured so that jitters that occur in the above signal-transmission interconnection can be adjusted by setting each of voltages of the first and the second voltage-applying interconnections.

According to the present invention, since electric charge is charged and discharged at the rising and falling edges of the above-mentioned signal, the rising and falling edges thereof become sharper. In addition, the rising and falling edges of the above-mentioned signal can be controlled by controlling timing when the capacitance of the above-mentioned MOS capacitance element changes rapidly. Timing when capacitance of the MOS capacitance element changes rapidly can be controlled by controlling the voltages of the above source and the drain and the voltage of the above well.

Consequently, according to the afore-mentioned semiconductor device, the rising and falling edges of the above signal can be controlled by controlling each of the voltages of the first and the second voltage-applying interconnections. Therefore, the above jitters of the signal can be restrained.

BRIEF DESCRIPTION OF THE DRAWINGS

FIG. 1 is a circuit diagram for explanation of a semiconductor device of the first embodiment.

FIG. 2 (A) and FIG. 2 (B) are views of adjusting characteristics of clock waveforms in the signal-transmission path of FIG. 1.

FIG. 22 (A) is a general perspective illustration of a semiconductor device of the sixteenth embodiment, and FIG. 22 (B) is an enlarged illustration of the semiconductor chip 152.

FIG. 23 is a circuit diagram for explanation of the conventional technology to make a rising edge of a clock sharper.

DETAILED DESCRIPTION OF THE INVENTION

Figure 3:
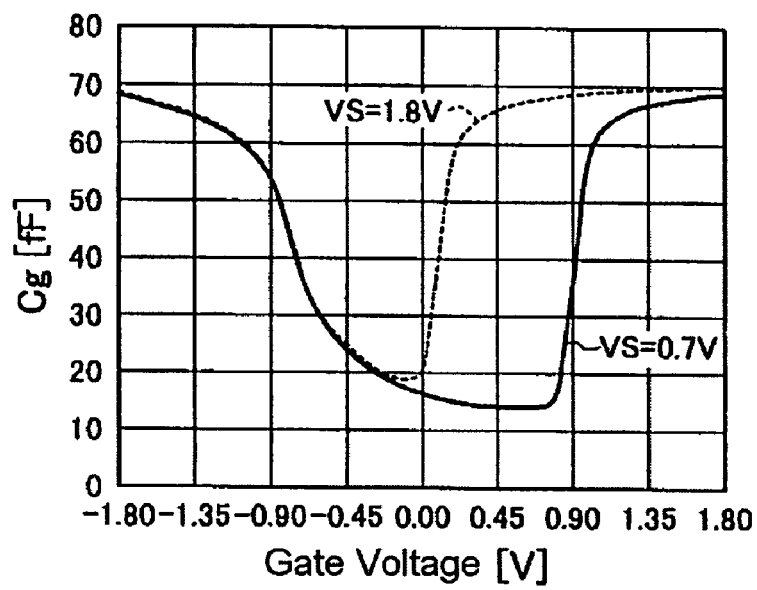
FIG. 3 is a graph showing changes of the capacitance Cg of the MOS capacitance element 10 by a voltage applied to the MOS capacitance element 10.

The Preferred embodiments of the invention will be explained as follows, referring to the drawings. FIG. 1 is an explanatory diagram of a configuration of a semiconductor device according to a first embodiment of the invention. The semiconductor device includes a signal transmission path.

The signal transmission path has a configuration that a MOS capacitance element 10 of a variable capacitance element is connected to a signal-transmission interconnection 20 for transmitting a digital signal.

A drain and a source of the MOS capacitance element 10 are connected to a first voltage-applying interconnection 30. And a well of the MOS capacitance element 10 is connected to a second voltage-applying interconnection 40. The first and second voltage-applying interconnections 30, 40 are connected to the ground interconnection 50 through capacitance elements 34, 44. The capacitance elements 34, 44 are, for example, MOS capacitance elements, however, diode-type capacitance elements having a first and a second impurity regions are applicable. In addition, a MIM-type capacitance element consisting of a first interconnection layer, an interlayer insulating film on the first interconnection layer, and a second conductive layer on the interlayer insulating film is applicable.

At the early stage of the clock rising edge in the signal-transmission interconnection 20, voltage rising is restrained by storing charge in the MOS capacitance element 10. Subsequently, after enough charge is stored in the MOS capacitance element 10, effect of restraining voltage rising thereof disappears, and then the voltage rises rapidly. As explained before, including the MOS capacitance element 10 makes the rising edge of clock signals sharper in the signal-transmission interconnection 20.

In addition, at the early stage of the clock falling edge, since charge is released from the MOS capacitance element 10, voltage dropping thereof is restrained. Subsequently, after enough charge is released from the MOS capacitance element 10, effect of restraining voltage dropping thereof disappears, and then the voltage drops rapidly. As explained before, including the MOS capacitance element 10 makes the falling edge of clock signals sharper in the signal-transmission interconnection 20.

To what frequency the behavior that the rising and falling edges of the clock become sharper can be obtained is judged as follows. In order to obtain the above-mentioned behavior, a necessary time for the electric charge to be charged to and be discharged from the MOS capacitance element 10 needs to be shorter than the clock period.

A hole density is assumed to be $10^{14}$ to $10^{15}$ pcs/cm$^3$, an electric field intensity is assumed to be 1.8V, a temperature is assumed to be 330K, and a distance L between a gate electrode and source/drain is assumed to be 0.5 um (gate electrode width to be 0.09 um). On the above assumptions, since a drift speed D becomes $7.2 \times 10^2$ (cm$^2$/s), the necessary time for the electric charge to be charged to and be discharged from the MOS capacitance element 10 becomes $L/D^{0.5} = 65$ (ps). In the case where a carrier is an electron, since the drift speed becomes ten times, the above time becomes 6.5 (ps).

Consequently, the behavior that the rising and falling edges of the clock become sharper can be obtained in the case where the clock frequency is 6 GHz, as well.

As explained before, the clock waveform transmitted by the signal-transmission interconnection 20 can be adjusted by connecting the MOS capacitance element 10 to the signal-transmission interconnection 20, and then the rising and falling edges of the clock waveform become sharper. In addition, considering the above-mentioned behavior, it is recognized that timing when the rising and falling edges of the clock waveform become sharper can be adjusted by adjusting timing when the capacitance of the MOS capacitance element 10 changes. Consequently, jitters of the clock transmitted by the signal-transmission interconnection 20 can be reduced or eliminated by adjusting timing when the capacitance of the MOS capacitance element 10 changes.

In addition, electric charge charges to and discharges from the MOS capacitance element 10, and then voltages of the first and second voltage-applying interconnections 30, 40 fluctuates, however, the above fluctuation is absorbed by the capacitance elements 34, 44. Therefore, the voltages of the first and second voltage-applying interconnections 30, 40 are stable.

Each of the drawings in FIG. 2 is a simulation result of adjusting characteristics of the clock waveform in the signal transmission path shown in FIG. 1. In each of the drawings, the broken line shows the clock waveform to be adjusted, and the solid line shows the adjusted clock waveform. FIG. 2 (A) is a simulation result in the case where the capacitance of the MOS capacitance element 10 changes rapidly by the voltage. FIG. 2 (B) is a simulation result in the case where the capacitance of the MOS capacitance element 10 changes slowly by the voltage. By comparison of the above graphs, it is recognized that the rising and the falling edges of the clock in FIG. 2 (A) is sharper than in FIG. 2 (B). Consequently, it is preferable to set the characteristics of the MOS capacitance element 10 so that the capacitance is changed rapidly by the voltage.

FIG. 3 is a graph showing how the capacitance Cg of the MOS capacitance element 10 is changed by the voltage applied to the MOS capacitance element 10. The graph thereof is a simulation result. The broken line shows the case where the voltage of the source and the drain is 1.8V, and the solid line shows the case where the voltage of the source and the drain is 1.1V. In addition, in both of the cases, the voltage of the well is fixed to 1.0V, and the gate length is the same as the gate width.

In the case where the voltage of the source and the drain is 1.8V, the capacitance of the MOS capacitance element 10 is changed rapidly at the gate voltage of around 1.8V. Meanwhile, in the case where the voltage of the source and the drain is 1.1V, the capacitance of the MOS capacitance element 10 is changed rapidly at the gate voltage of around 0.9V. As explained before, the gate voltage to change rapidly the capacitance of the MOS capacitance element 10 can be adjusted by adjusting the source and the drain voltages (the voltage of the first voltage-applying interconnection 30 in FIG. 1) to the well voltage (the voltage of the second voltage-applying interconnection 40 in FIG. 1).

Consequently, jitters of the clock transmitted by the signal-transmission interconnection 20 can be reduced or eliminated by adjusting the voltage of the first voltage-applying interconnection 30 to the voltage of the second voltage-applying interconnection 40.

Figure 4:
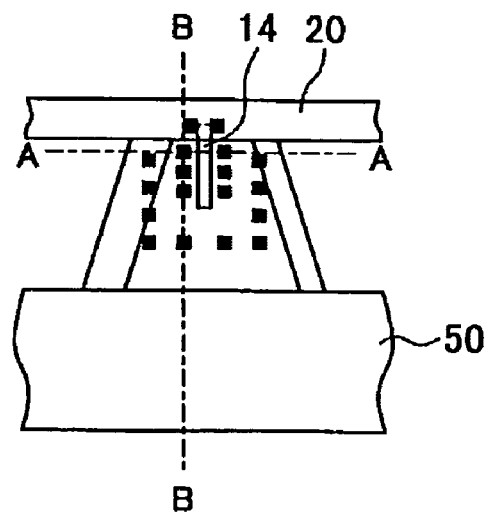
FIG. 4 is a plan view of a first example of the semiconductor device of the circuit diagram of FIG. 1.

FIG. 4 is a plane view of a first example of the semiconductor device of the circuit shown in FIG. 1. According to the present example, the first and the second voltage-applying interconnections 30, 40 and a ground interconnection 50 (hereinafter referred to as "the first voltage-applying interconnection 30, etc.") are overlapped through the interlayer insulating film, respectively. The signal-transmission interconnection 20 is formed in parallel to the first voltage-applying interconnection 30, etc. The MOS capacitance element 10 is formed between the signal-transmission interconnection 20 and the first voltage-applying interconnection 30, etc. A gate electrode 14 of the MOS capacitance element 10 is formed approximately vertically to the signal-transmission interconnection 20.

Figure 5A:
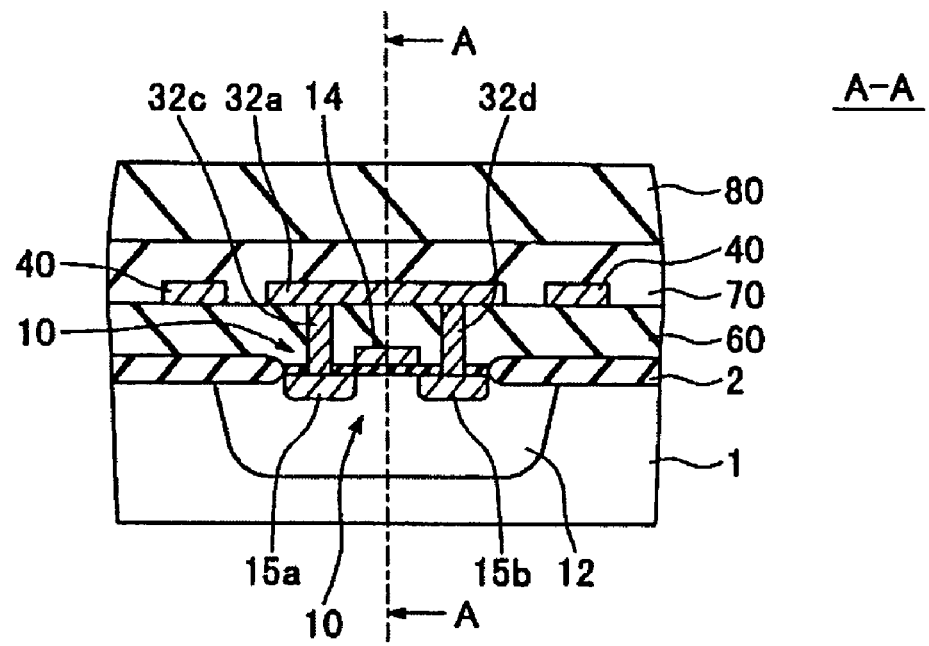
FIG. 5 (A) is an A-A cross section of FIGS. 4, and (B) is a B-B cross section of FIG. 4.
Figure 5B:
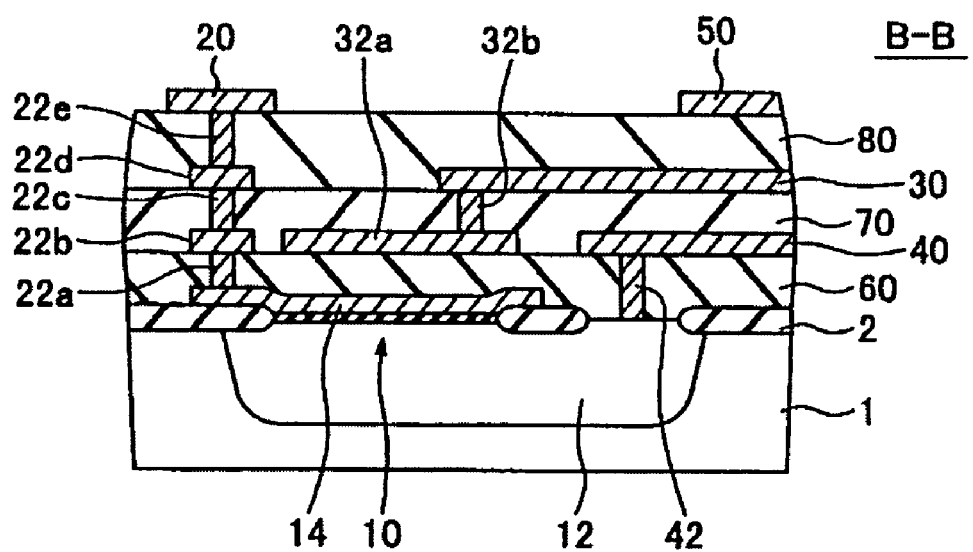

FIG. 5 (A) is an A-A cross section of FIG. 4, and FIG. 5 (B) is a B-B cross section of FIG. 4. An element isolation film 2 is formed on a silicon substrate 1. Interlayer insulating films 60, 70, 80 are stacked on the element isolation film 2 in the order of from 60 to 70 to 80.

The signal-transmission interconnection 20 is placed on the interlayer insulating film 80, and is connected to the gate electrode 14 through conductors 22a, 22c, 22e formed in the interlayer films 60, 70, 80 and conductive films 22b, 22d placed on each of the interconnection layers.

The second voltage-applying interconnection 40 is placed on the interlayer insulating film 60, and the first voltage-applying interconnection 30 is placed on the interlayer insulating film 70. The first voltage-applying interconnection 30 is connected to a connecting conductive film 32a placed on the interlayer insulating film 60 through a conductor 32b formed in the interlayer insulating film 70. The connecting conductive film 32a is located over the MOS capacitance element 10, and connected to second conductive-type (for example, n-type) impurity regions 15a of a source, 15b of a drain through the conductors 32c, 32d formed in the interlayer film 60, respectively.

The second voltage-applying interconnection 40 is connected to a first conductive-type (for example, p-type) well 12 of the MOS capacitance element 10 through a conductor 42 formed in the interlayer insulating film 60.

In addition, the ground interconnection 50 is placed on the interlayer insulating film 80, and is connected to the first and the second voltage-applying interconnections 30, 40 through capacitance elements 34, 44, in a region not shown in the drawings.

As explained before, according to the present example, the signal-transmission interconnection 20 and the ground interconnection 50 are placed interconnection layer of the most upper layer. Consequently, parasitic capacitances and inductances between the MOS capacitance element 10 and either of the ground interconnection 50 and the signal-transmission interconnection 20 can be reduced.

Figure 6A:
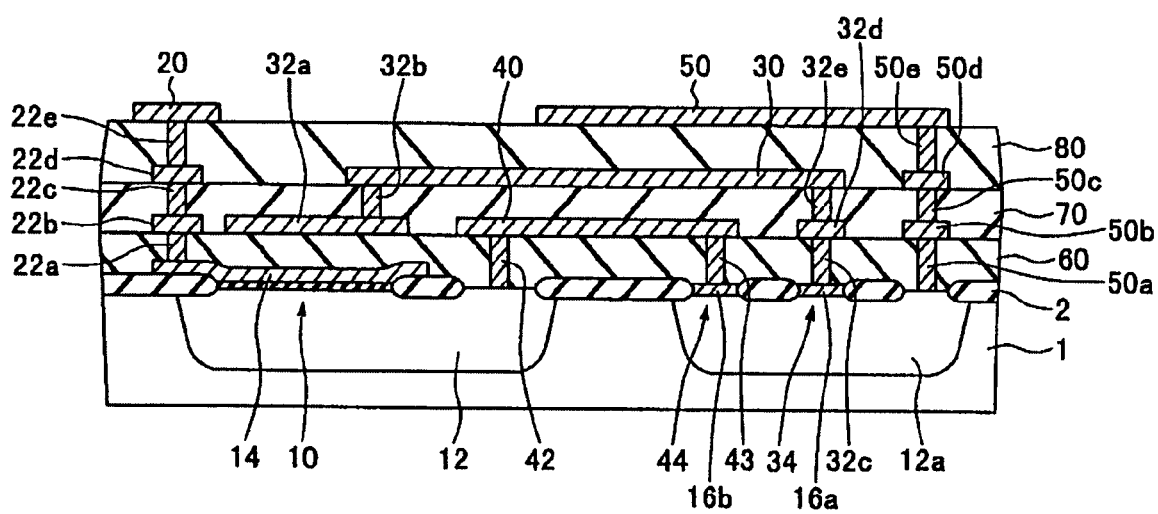
FIG. 6 (A) is a second example of the semiconductor device of the circuit diagram of FIGS. 1, and (B) is a third example of the semiconductor device of the circuit diagram of FIG. 1.
Figure 6B:
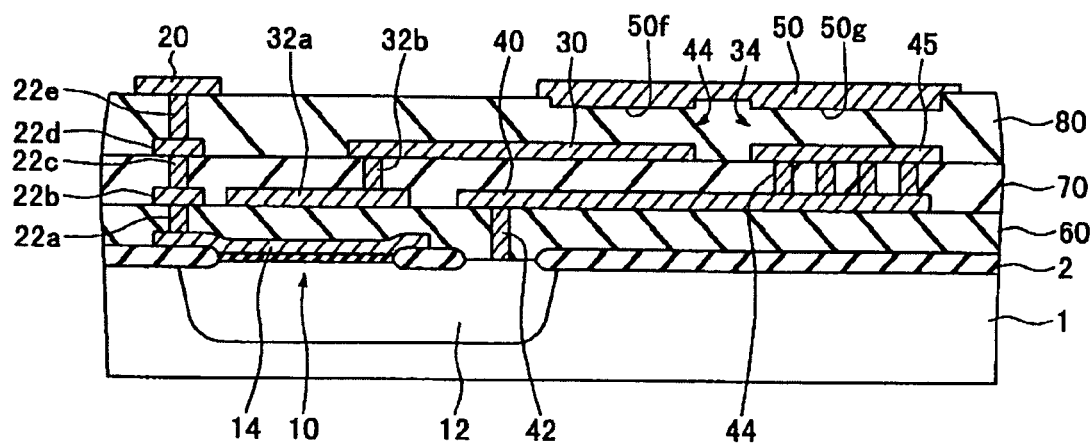

FIG. 6 (A) is a cross section of a second example of the semiconductor device having the circuit diagram shown in FIG. 1. FIG. 6 (A) shows the case where capacitance elements 34, 44 are diode types. Hereinafter, elements identical to the ones in FIG. 5 are given the same numerals as in FIG. 5, and the explanations thereof will be omitted.

In FIG. 6 (A), the capacitance element 34 consists of a first conductive-type (for example, p-type) well 12a, and a second conductive-type (for example, n-type) impurity region 16a formed in the well 12a. In addition, the capacitance element 44 consists of the well 12a and a second conductive-type (for example, n-type) impurity region 16b formed in the well 12a.

The impurity region 16a is connected to the first voltage-applying interconnection 30 through the conductors 32c, 32e formed in the interlayer insulating films 60, 70 and the conductive film 32d placed on the interlayer insulating film 60. The impurity region 16b is connected to the second voltage-applying interconnection 40 through a conductor 43 formed in the interlayer insulating film 60. The well 12a is connected to the ground interconnection 50 through conductors 50a, 50c, 50e formed in the interlayer insulating films 60, 70, 80 and conductive films 50b, 50d placed on the interlayer insulating films 60, 70.

FIG. 6 (B) is a cross section of a third example of the semiconductor device having the circuit diagram shown in FIG. 1. FIG. 6 (B) shows the case where capacitance elements 34, 44 are MIM-type capacitance elements. Hereinafter, elements identical to the ones in FIG. 5 are given the same numerals as in FIG. 5, and the explanations thereof will be omitted.

In FIG. 6 (B), the capacitance element 34 consists of the ground interconnection 50, the first voltage-applying interconnection 30, and the interlayer insulating film 80 placed between the ground interconnection 50 and the first voltage-applying interconnection 30.

Furthermore, the capacitance element 44 consists of a conductive film 45 formed in the same layer as the first voltage-applying interconnection 30, the ground interconnection 50, and the interlayer insulating film 80 placed between the ground interconnection 50 and the conductive film 45. The conductive film 45 is connected to the second voltage-applying interconnection 40 through the conductor 44 formed in the interlayer insulating film 70.

In addition, an upper part of the interlayer insulating film 80 in the regions for the capacitance elements 34, 44 is a concave shape, and the ground interconnection 50 is formed in the concave part. By the above structure, the interlayer insulating film 80 composing the capacitance elements 34, 44 becomes thinner, and the capacitances of the capacitance elements 34, 44 become larger.

As explained before, according to the first embodiment of the invention, the clock waveforms transmitted by the signal-transmission interconnection 20 can be adjusted by connecting the gate electrode 14 of the MOS capacitance element 10 to the signal-transmission interconnection 20, and then the rising and falling edges of the clock waveform become sharper. Therefore, the signal can be transmitted accurately at higher frequencies.

In addition, the timing when the rising and falling edges of the clock waveform become sharper can be changed by changing the source voltage and drain voltage to the well voltage of the MOS capacitance element 10. Therefore, jitters of the clock transmitted by the signal-transmission interconnection 20 can be reduced or eliminated by adjusting the source voltage and the drain voltage to the well voltage of the MOS capacitance element 10. Consequently, interconnections (for example, interconnection connecting ALU and cash memory each other in bi-directions) can be lengthened within the monolithic semiconductor device operating at high frequency.

In addition, in the above-mentioned diagram, the MOS capacitance element 10 is a n-type MOS capacitance element, however, a p-type MOS capacitance element can bring the same effect. Furthermore, directional couplers can be put at the input and the output terminals of the signal transmission path of FIG. 1 in order to prevent reflection. In addition, the signal transmission path of FIG. 1 can be used to make the rising edge and the falling edge of the clock signal sharper.

Figure 7:
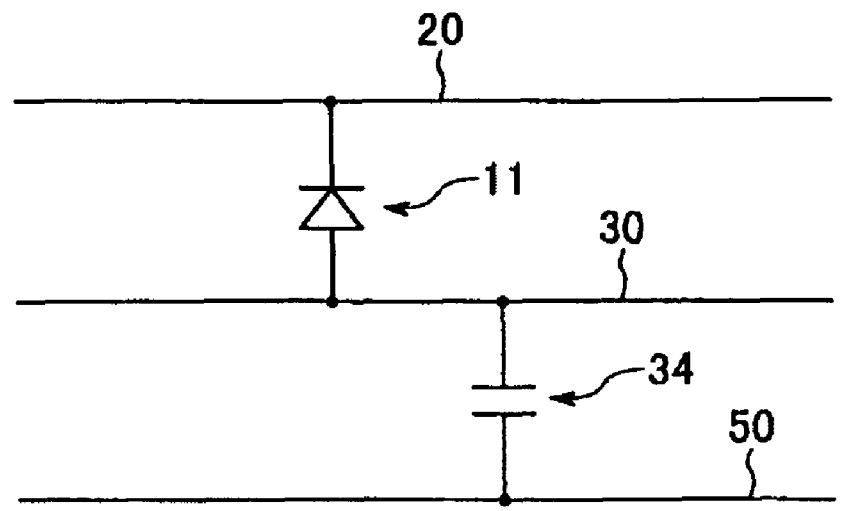
FIG. 7 is a circuit diagram for explanation of a semiconductor device of the second embodiment.

FIG. 7 is a circuit diagram for explanation of a semiconductor device configuration according to the second embodiment of the invention. The configuration is the same as in the first embodiment except that the diode-type capacitance element 11 is included instead of the MOS capacitance element 10, and the second voltage-applying interconnection 40 or the capacitance element 44 is not included. The diode-type capacitance element 11 consists of, for example, a first conductive-type well formed on a silicon substrate, and a second conductive-type impurity region formed on the well. The elements identical to the ones in the first embodiment are given the same numerals and the explanations thereof will be omitted as follows.

The diode-type capacitance element 11 includes the second conductive-type impurity region connected to the signal-transmission interconnection 20 and the well connected to the first voltage-applying interconnection 30.

According to the present embodiment, the voltage to change the capacitance of the diode-type capacitance element 11 can be adjusted by adjusting the voltage of the first voltage-applying interconnection 30, as well. Consequently, the same effect as in the first embodiment can be obtained.

Figure 8:
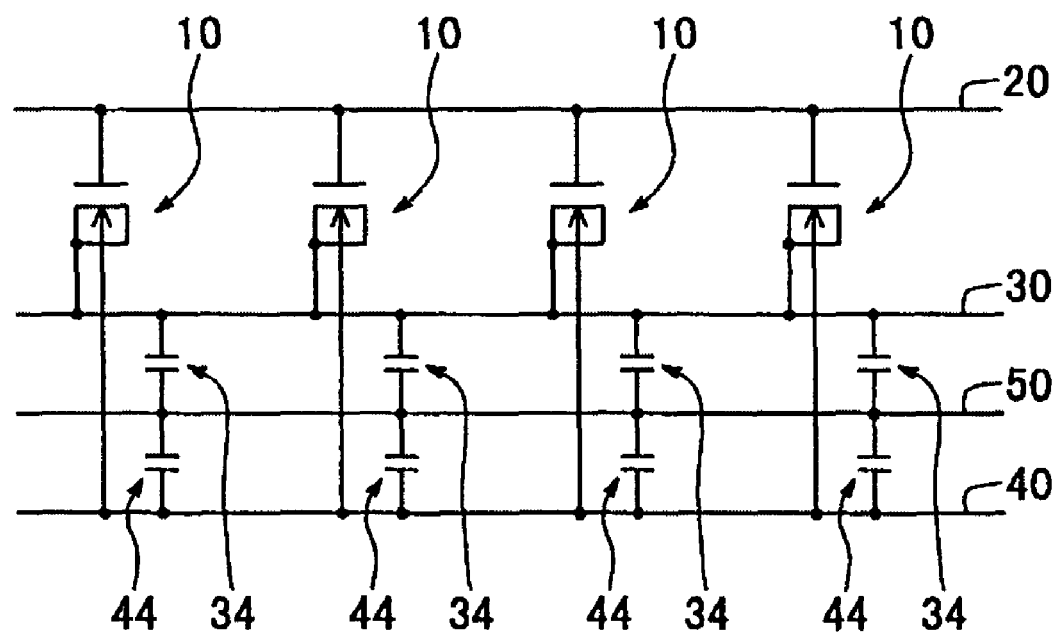
FIG. 8 is a circuit diagram for explanation of a semiconductor device of the third embodiment.

FIG. 8 is a circuit diagram for explanation of a semiconductor device according to the third embodiment of the invention. The present invention has the same configuration as in the first embodiment except that a plurality of the MOS capacitance element 10 and a plurality of the capacitance elements 34, 44 are included. The elements identical to the ones in the first embodiment are given the same numerals and the explanations thereof will be omitted as follows.

Each of a plurality of the MOS capacitance elements 10 has a gate electrode connected to the signal-transmission interconnection 20, and a source and a drain connected to the first voltage-applying interconnection 30. Each of wells of a plurality of the MOS capacitance elements 10 is connected to the second voltage-applying interconnection 40. The capacitance elements 34, 44 are placed between two adjacent elements of the plurality of MOS capacitance elements 10 in the line-length direction of the first and the second voltage-applying interconnections 30, 40.

According to the present embodiment, the same effect as in the first embodiment can be obtained. In addition, since a plurality of the MOS capacitances 10 are included, the rising and the falling edges of the clock waveforms transmitted by the signal-transmission interconnection 20 become much more sharper. Furthermore, since the capacitance elements 34, 44 are placed between two adjacent elements of the plurality of MOS capacitance elements 10, respectively, influence on the voltage between the adjacent MOS capacitance elements 10 caused by charging into and discharging from the MOS capacitance elements 10 can be restrained.

In addition, a diode-type capacitance element 11 of the second embodiment can be used instead of the MOS capacitance element 10.

Figure 9:
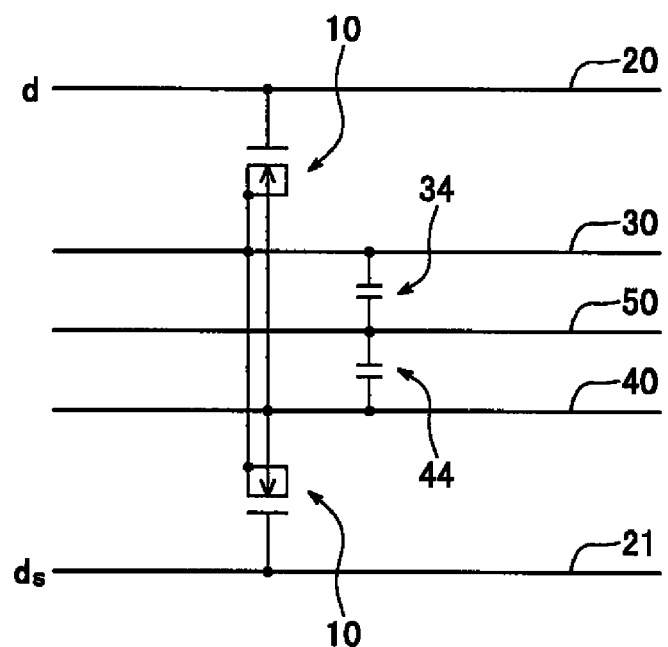
FIG. 9 is a circuit diagram for explanation of a semiconductor device of the fourth embodiment.

FIG. 9 is a circuit diagram for explanation of a semiconductor device configuration according to the fourth embodiment of the invention. The present embodiment has the same configuration as in the first embodiment except that a signal-transmission interconnection 21 parallel to the signal-transmission interconnection 20 is included and the MOS capacitance element 10 is connected to the signal-transmission interconnection 20. The elements identical to the ones in the first embodiment are given the same numerals and the explanations thereof will be omitted as follows.

The signal-transmission interconnection 21 transmits an inverted signal ds of a signal d transmitted by the signal-transmission interconnection 20. In other words, the signal-transmission interconnections 20, 21 transmit differential signals. In addition, the MOS capacitance element 10 connected to the signal-transmission interconnection 20 and the MOS capacitance element 10 connected to the signal-transmission interconnection 21 have sources and drains thereof connected to the first voltage-applying interconnection 30, wells thereof connected to the second voltage-applying interconnection 40.

The present embodiment brings the same effect as the first embodiment. In addition, the diode-type capacitance element 11 of the second embodiment can be used instead of the MOS capacitance element 10. In the above case, the second voltage-applying interconnection 40 and the capacitance element 44 are unnecessary.

Figure 10:
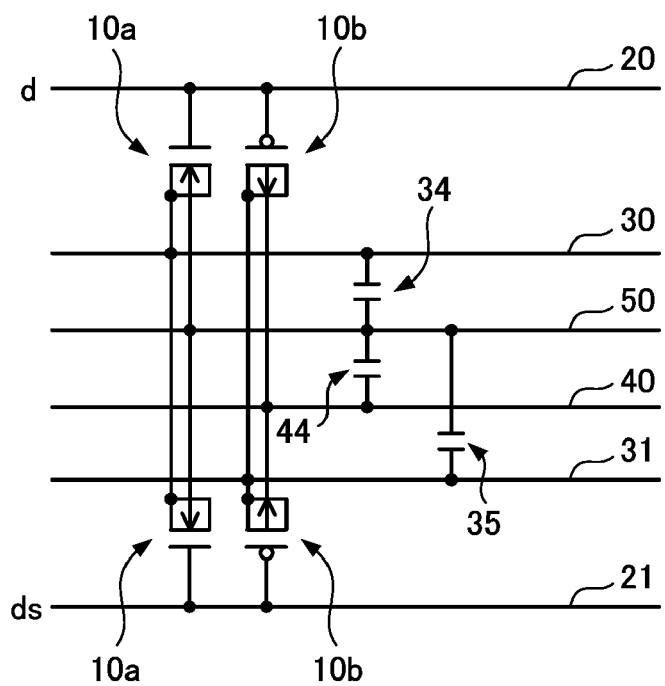
FIG. 10 is a circuit diagram for explanation of a semiconductor device of the fifth embodiment.

FIG. 10 is a circuit diagram for explanation of a semiconductor device configuration according to the fifth embodiment of the invention. The present embodiment has the same configuration as in the fourth embodiment except that a CMOS composed by a n-type MOS capacitance element 10a and a p-type MOS capacitance element 10b is included instead of the MOS capacitance element 10 and a third voltage-applying interconnection 31 and a capacitance element 35 is included.

The elements identical to the ones in the fourth embodiment are given the same numerals and the explanations will be omitted as follows.

A source and a drain of the n-type MOS capacitance element 10a are connected to the first voltage-applying interconnection 30, and a well of the n-type MOS capacitance element 10a is connected to the ground interconnection 50. A source and a drain of the p-type MOS capacitance element 10b are connected to the third voltage-applying interconnection 31, and a well of the p-type MOS capacitance element 10b is connected to the second voltage-applying interconnection 40. The third voltage-applying interconnection 31 is connected to the ground interconnection 50 through the capacitance element 35. The configuration of the capacitance element 35 is the same as that of the capacitance elements 34, 44.

Figure 11:
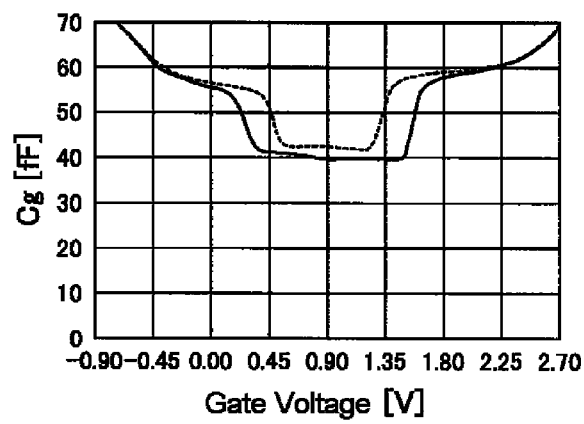
FIG. 11 is a view of changes of the capacitance sum of two of the MOS capacitance elements 10a, 10b.

FIG. 11 is a graph showing the change of the capacitance sum Cg of two of the above MOS capacitance elements 10a, 10b by the voltages applied to the n-type MOS capacitance element 10a and the p-type MOS capacitance element 10b. The graph shows results of simulations. The solid line shows the case where the source voltage and the drain voltage of the n-type MOS capacitance element 10a are 1.1V, and the source voltage and the drain voltage of the p-type MOS capacitance element 10b are 0.7V. In addition, the broken line shows the case where the source voltage and the drain voltage of each of the n-type MOS capacitance element 10a and the p-type MOS capacitance element 10b are 0.9V. Furthermore, in the above both cases, the well voltage of n-type MOS capacitance element 10a is fixed to 0V, and the well voltage of the p-type MOS capacitance element 10b is fixed to 1.8V. In addition, the gate width is five times as large as the gate length.

As shown in the above graph, capacitance sum of the n-type MOS capacitance element 10a and p-type MOS capacitance element 10b can be changed by changing the source voltage and the drain voltage. Consequently, the present embodiment can bring the same effect as the fourth embodiment. In addition, in the both cases where the capacitance value rises or falls, the capacitance changes rapidly. Therefore, the rising edge or falling edge can become much more sharper, as explained by FIG. 2 in the case of the first embodiment.

Figure 12:
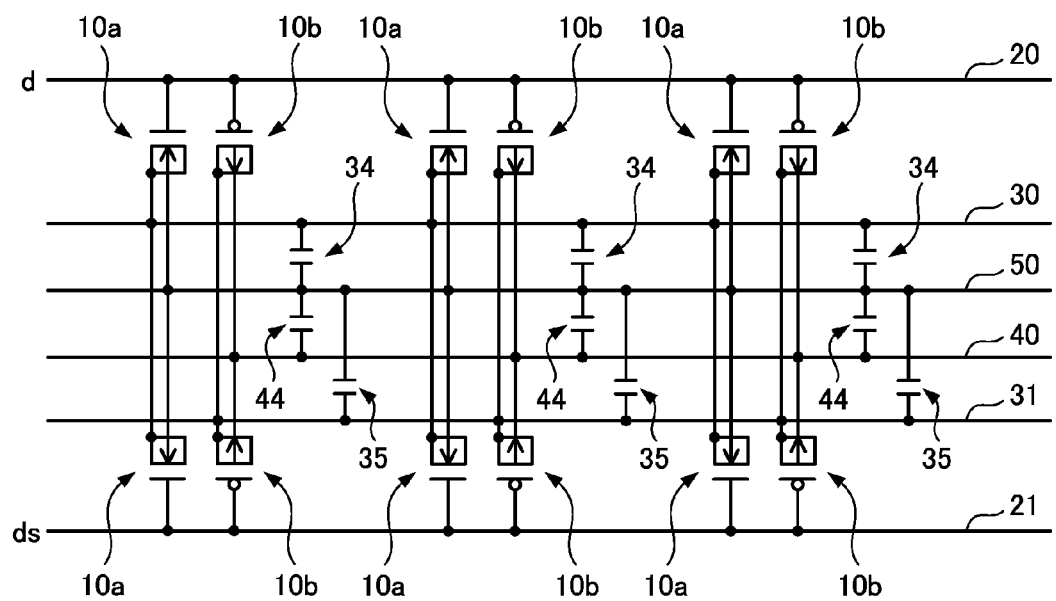
FIG. 12 is a circuit diagram for explanation of a semiconductor device of the sixth embodiment.

FIG. 12 is a circuit diagram for explanation of a semiconductor device configuration according to the sixth embodiment of the invention. The present embodiment has the same configuration as in the fifth embodiment except that a plurality of the CMOS capacitance elements, in other words, the n-type MOS capacitance elements and the p-type MOS capacitance elements and a plurality of the capacitance elements 34, 44 are included. The elements identical to the ones in the fifth embodiment are given the same numerals and the explanations thereof will be omitted as follows.

The present embodiment can bring the same effect as the fifth embodiment. In addition, since a plurality of the CMOS capacitance element are included, the rising and falling edges of the clock signal transmitted by the signal-transmission interconnection 20 can become much more sharper. Furthermore, since the capacitance elements 34, 44 are connected to two adjacent elements of the plurality of CMOS capacitance elements, respectively, influence on the voltage of the adjacent CMOS capacitance elements caused by charging into and discharging from the CMOS capacitance elements can be restrained.

Figure 13:
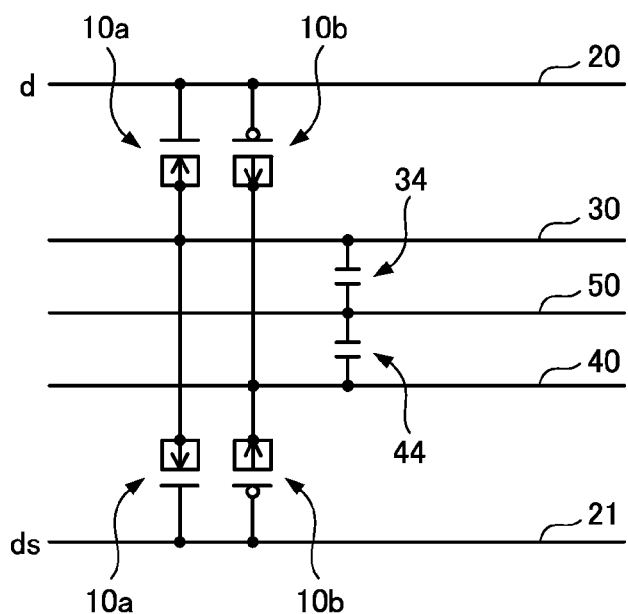
FIG. 13 is a circuit diagram for explanation of a semiconductor device of the seventh embodiment.

FIG. 13 is a circuit diagram for explanation of a semiconductor device configuration according to the seventh embodiment of the invention. The present embodiment has the same configuration as in the fifth embodiment except that the third voltage-applying interconnection 31 or the capacitance element 35 is not included, a source, a drain, and a well of the n-type MOS capacitance element 10a are connected to the first voltage-applying interconnection 30, and a source, a drain, and a well of the p-type MOS capacitance 10b are connected to the second voltage-applying interconnection 40. The elements identical to the ones in the fifth embodiment are given the same numerals and the explanations thereof will be omitted as follows. The present embodiment can bring the same effect as the fifth embodiment.

Figure 14:
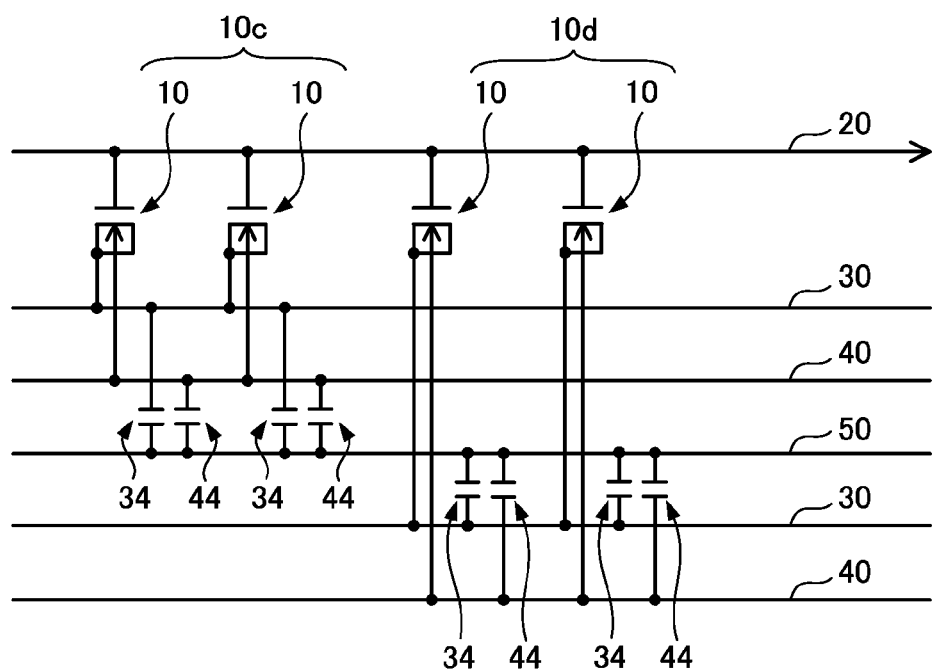
FIG. 14 is a circuit diagram for explanation of a semiconductor device of the eighth embodiment.

FIG. 14 is a circuit diagram for explanation of a semiconductor device configuration according to the eighth embodiment of the invention. The present embodiment has the same configuration as in the third embodiment except that a plurality of the first voltage-applying interconnection 30 and a plurality of the second voltage-applying interconnection 40 are included, and except that the MOS capacitance elements 10 is divided to combinations 10c and 10d, and the first voltage-applying interconnection 30 and the second voltage-applying interconnection 40 are different ones with respect to each of the combination 10c, 10d. The voltages of a plurality of the first voltage-applying interconnection 30 and the voltages of the second voltage-applying interconnection 40 are controlled independently from each other, respectively.

The elements identical to the ones in the third embodiment are given the same numerals and the explanations thereof will be omitted as follows.

The present embodiment can bring the same effect as the third embodiment. In addition, since characteristics of the MOS capacitance element 10 can be changed step by step along the line length direction of the signal-transmission interconnection 20, effect of adjusting the waveform of the clock signal can be changed step by step along the line length direction of the signal-transmission interconnection 20.

Furthermore, a diode-type capacitance element 11 shown in the second embodiment can be used instead of the MOS capacitance element 10. In the above case, the second voltage-applying interconnection 40 and the capacitance element 44 are unnecessary.

Figure 15:
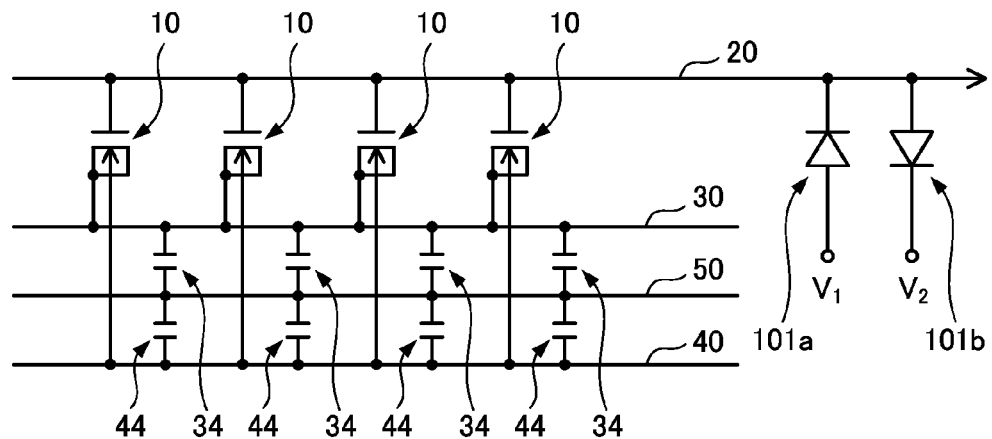
FIG. 15 is a circuit diagram for explanation of a semiconductor device of the ninth embodiment.

FIG. 15 is a circuit diagram for explanation of a semiconductor device configuration according to the ninth embodiment of the invention. The present embodiment has the same configuration as in the third embodiment except that diodes 101a, 101b having a function of voltage limiter are connected to the signal-transmission interconnection 20. The diodes 101a, 101b are placed at a more forward position in the signal transmission direction than a plurality of the MOS capacitance element 10. Voltages $V_1$, $V_2$ applied to the diodes 101a, 101b are constant.

The present embodiment can bring the same effect as the third embodiment. In addition, an upper limit of the clock waveform transmitted by the signal-transmission interconnection 20 is set by the diode 101a and a lower limit of the clock waveform is set by the diode 101b. Consequently, the amplitude of the clock waveform is limited by the diodes 101a, 101b, and an effect of adjusting the clock waveform becomes larger. Furthermore, the clock amplitude limited by the diodes 101a, 101b can be controlled by changing the voltages $V_1$, $V_2$.

In addition, the diode-type capacitance element 11 of the second embodiment can be used instead of the MOS capacitance element 10. In the above case, the second voltage-applying interconnection 40 and capacitance element 44 are unnecessary.

Figure 16:
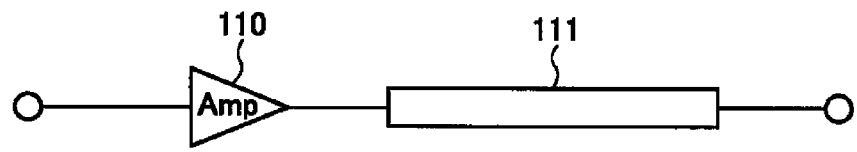
FIG. 16 is a circuit diagram for explanation of a relay amplifier of the tenth embodiment.

FIG. 16 is a circuit diagram for explanation of a relay amplifier configuration according to the tenth embodiment of the invention. A relay amplifier according to the present embodiment has a configuration that a signal transmission path 111 is connected to an amplifier 110. The signal transmission path 111 is the signal transmission path according to any of the first to the ninth embodiments.

According to the relay amplifier of the present embodiment, the signal can be amplified by the amplifier 110 and the clock waveform can be adjusted by the signal transmission path 111.

Figure 17:
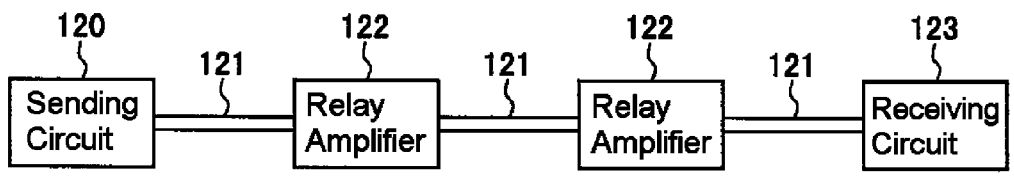
FIG. 17 is a circuit diagram for explanation of a signal-transmission path of the eleventh embodiment.

FIG. 17 is a circuit diagram for explanation of a signal transmission circuit according to the eleventh embodiment of the invention. The present embodiment has a configuration that a sending circuit 120 and a receiving circuit 123 are connected by a signal-transmission interconnection 121, and a plurality of relay amplifiers 122 are placed along the signal-transmission interconnection 121. The relay amplifier 122 has the same configuration as the relay amplifier 122 according to the tenth embodiment.

According to the present embodiment, since a signal received by the sending circuit 120 is sent while being amplified and improved by the relay amplifier 122, the signal can be precisely sent to the receiving circuit 123.

Figure 18:
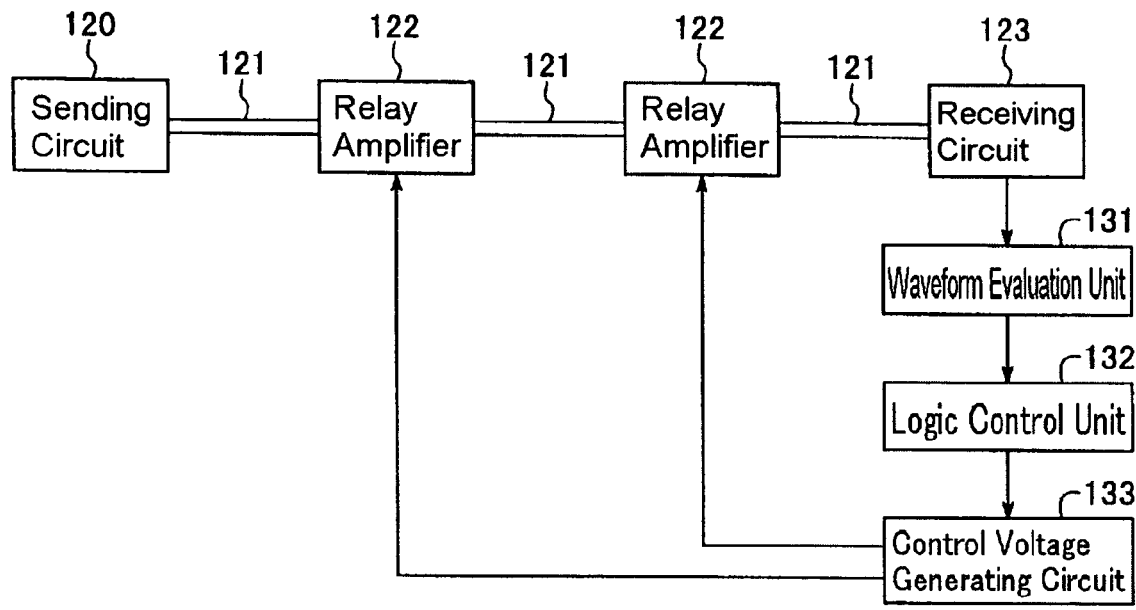
FIG. 18 is a circuit diagram for explanation of a signal-transmission path of the twelfth embodiment.

FIG. 18 is a circuit diagram for explanation of a configuration of a signal transmission circuit according to the twelfth embodiment of the invention. The present embodiment has the same configuration as the signal-transmission circuit according to the eleventh embodiment except that a waveform evaluation unit 131, a logic control unit 132, and a control voltage generating circuit 133 are included. The elements identical to the ones in the eleventh embodiment are given the same numeral and the explanations thereof will be omitted as follows.

The control voltage generating circuit 133 controls the voltage of the voltage-applying interconnection (for example, the first and the second voltage-applying interconnections 30, 40 of FIG. 1) on the signal-transmission path 111 (shown in FIG. 16) included in the relay amplifier 122. The waveform evaluation unit 131 evaluates the waveform of the clock signal received by the receiving circuit 123. The logic control unit 132 improves a waveform of the clock signal received by the receiving circuit 123 by changing a voltage generated by the control-voltage generating circuit 133 according to a predetermined logic, in the case where an evaluation result of the waveform evaluation unit 131 is not good.

The present embodiment can bring the same effect as the eleventh embodiment. In addition, since a feedback control is performed on characteristics of adjusting the clock waveform of the relay amplifier 122, the clock waveform received by the receiving circuit 123 becomes much better.

Figure 19:
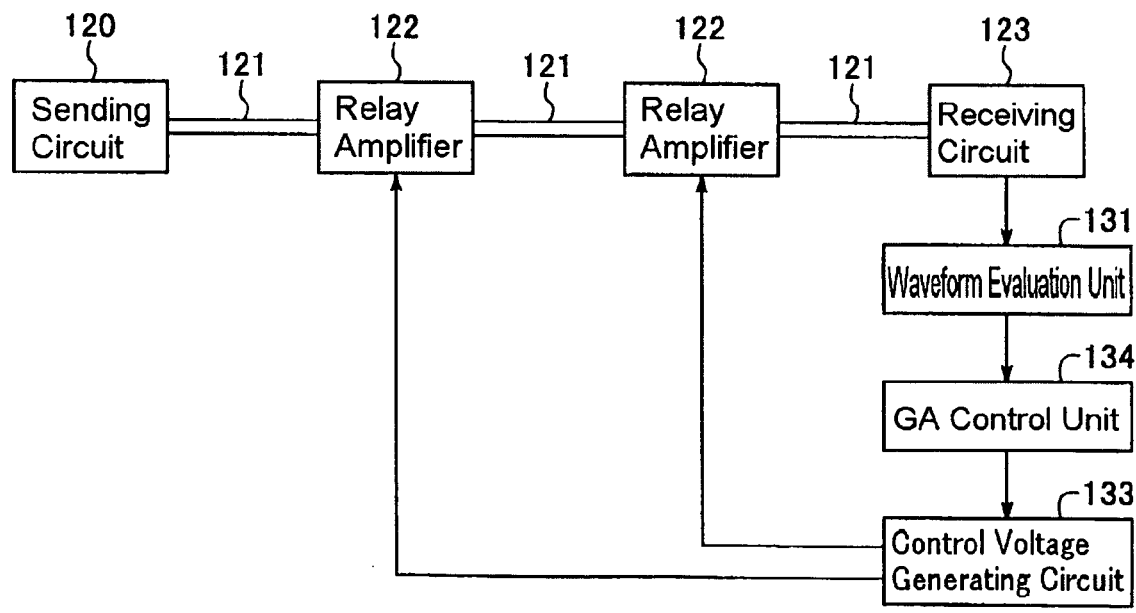
FIG. 19 is a circuit diagram for explanation of a signal-transmission path of the thirteenth embodiment.

FIG. 19 is a circuit diagram for explanation of a configuration of a signal transmission circuit configuration according to the thirteenth embodiment of the invention. The present embodiment is the same as signal transmission circuit configuration according to the twelfth embodiment of the invention except that a GA control unit 134 is included instead of a logic control unit 132. The elements identical to the ones in the twelfth embodiment are given the same numeral and the explanations thereof will be omitted as follows.

In the GA control unit 134, in the case where an evaluation result of the waveform evaluation unit 131 is not good, a waveform of the clock signal received by the receiving circuit 123 is improved by changing a voltage generated by the control voltage generating circuit 133 accordingly to a genetic algorithm. The present embodiment can bring the same effect as the twelfth embodiment.

Figure 20:
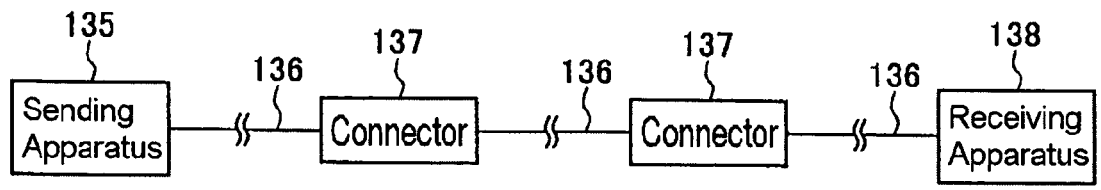
FIG. 20 is a block diagram for explanation of a signal-transmission system device of the fourteenth embodiment.

FIG. 20 is a block diagram for explaining a configuration of a signal transmission system according to the fourteenth embodiment of the invention. A signal transmission system of the present embodiment connects between a sending apparatus 135 and a receiving apparatus 138 by a cable 136, and includes a plurality of connectors 137 along the cable 136. The relay amplifier of the tenth embodiment is formed in the connectors 137.

According to the present invention, since a signal received by the sending apparatus 135 is transmitted while being amplified and improved, the signal can be transmitted precisely to the receiving apparatus 138.

Figure 21:
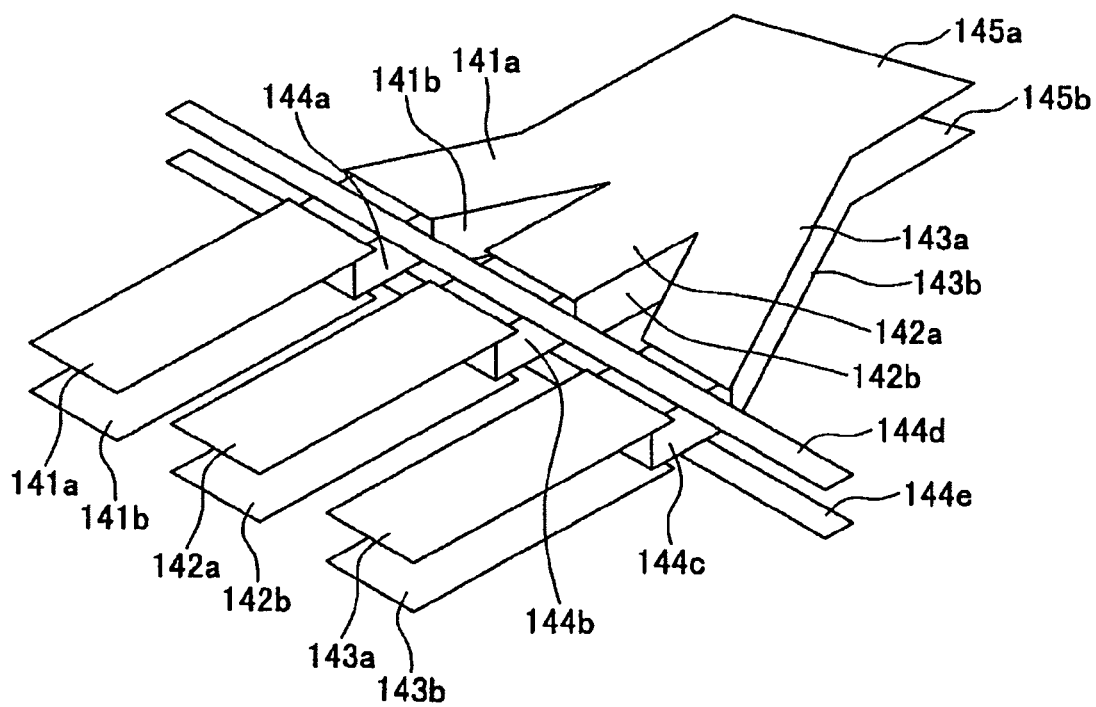
FIG. 21 is a general diagram for explanation of a configuration of a mixer of the fifteenth embodiment.

FIG. 21 is a general diagram for explaining a configuration of a mixer according to the fifteenth embodiment of the invention. The mixer according to the fifteenth embodiment mixes signals transmitted by signal-transmission interconnections 141a, 142a, 143a, respectively, to transmit the signals by a signal-transmission interconnection 145a, and mixes signals transmitted by signal-transmission interconnections 141b, 142b, 143b, respectively, to transmit the signals by a signal-transmission interconnection 145b. The signal-transmission interconnections 141b, 142b, 143b are placed so as to face the signal-transmission interconnections 141a, 142a, 143a, respectively. The signals transmitted by signal-transmission interconnections 141b, 142b, 143b are obtained by inverting the signals of the signal-transmission interconnections 141a, 142a, 143a.

In the signal-transmission interconnections 141a, 141b, a waveform adjusting element 144a located slightly before the signal-transmission interconnections 145a, 145b is placed. In the signal adjusting element 144a, the signal-transmission path shown in the sixth embodiment (FIG. 9) is included, the signal-transmission interconnection 20 is connected to the signal-transmission interconnection 141a, and the signal-transmission interconnection 21 is connected to the signal-transmission interconnection 141b.

In each of the signal transmissions 142a, 142b and the signal-transmission interconnections 143a, 143b, the waveform adjusting element 144b and the waveform adjusting element 144c are included. The location and the configuration of the waveform adjusting elements 144b, 144c are the same as those of the waveform adjusting element 144a. In addition, the waveform adjusting elements 144a to 144c are connected to a first voltage-applying interconnection 144d and a second voltage-applying interconnection 144e, respectively.

According to the present embodiment, jitters between the signal-transmission interconnections 141a, 142a, 143a, and jitters between the signal-transmission interconnections 141b, 142b, 143b can be reduced, respectively. Therefore, characteristic impedances of the signal-transmission interconnections 141a, 142a, 143a and a characteristic impedance of the signal-transmission interconnections 145a in the signal traveling direction can be matched to each other, and a characteristic impedance of the signal-transmission interconnections 141b, 142b, 143b and a characteristic impedance of the signal-transmission interconnections 145b in the signal traveling direction can be matched to each other. In addition, a divider can be formed by the similar configuration to the present embodiment.

FIG. 22(A) is a general perspective illustration of a semiconductor device according to the sixteenth embodiment of the invention. The semiconductor device according to the present embodiment has a configuration that plural of semiconductor chips 152 are formed on the printed-circuit board 150. In the printed-circuit board 150, external input terminals of the semiconductor device (not shown in the illustration) are included, and the waveform-adjusting element 151 is placed between the above external input terminals and the semiconductor chip 152. In the waveform-adjusting element 151, the signal-transmission paths shown in the first to the ninth embodiments are formed. Therefore, the waveform of the clock signal inputted to the external input terminal is adjusted before being transmitted to the semiconductor chip 152.

FIG. 22 (B) is an enlarged illustration of the semiconductor chip 152. Each of a plurality of pads 161 included in the semiconductor chip 152 is connected to an expanded interconnection 172 through a bonding wire 171. The expanded interconnections 172 are connected to board interconnections 173 of the printed-circuit board 150, respectively. A waveform-adjusting element 151 is placed on a board interconnection 173b. A board interconnection 173a adjacent to the waveform adjusting element 151 is cut along the path, and the part being cut is bridged by the waveform adjusting element 151. Consequently, the waveform of the clock signal transmitted by the above board interconnection 173a is adjusted before being transmitted to the semiconductor chip 152.

In addition, the waveform-adjusting element 151 is included in the semiconductor chip 152, as well. Therefore, the waveform of the clock signal transmitted inside the semiconductor chip 152 is adjusted while being transmitted.

As explained before, according to the present embodiment, the waveform of the clock signal transmitted inside the semiconductor device can be adjusted. Therefore, the signals can be transmitted precisely.

In addition, the present invention is not limited to the above-mentioned embodiments, and embodiments can be changed variously within the scope of the present invention. For example, in the second embodiment, a plurality of the diode-type capacitance elements 11 and a plurality of capacitance elements 34 can be included. In the above case, the capacitance elements 34 are placed between the diode-type capacitance elements 11.

The present invention is applicable to a semiconductor device including signal-transmission interconnections preferable for transmitting high frequency signal and capability to adjust characteristics of the above signal-transmission interconnections, and a method for adjusting characteristics of the semiconductor device.

What is claimed is:

1. A semiconductor device comprising:
   a signal-transmission interconnection for transmitting signals;
   a MOS capacitance element having a source, a drain, a well, and a gate electrode connected to said signal-transmission interconnection;
   a first voltage-applying interconnection being connected to said source and said drain of said MOS capacitance element, and said first voltage-applying interconnection being configured to apply a voltage to said source and said drain of said MOS capacitance element; and
   a second voltage-applying interconnection being connected to said well of said MOS capacitance element, and said second voltage-applying interconnection being configured to apply a voltage to said well of said MOS capacitance element,
   wherein the voltages of said first and second voltage-applying interconnections are controlled independently from each other.

2. The semiconductor device of claim 1, wherein said signal-transmission interconnection transmits digital signals.

3. The semiconductor device of claim 1, further comprising a voltage limiting circuit including (i) a first diode having an anode connected to said signal-transmission interconnection and a cathode connected to a first variable voltage source, and (ii) a second diode having a cathode connected to said signal-transmission interconnection and an anode connected to a second variable voltage source.

4. The semiconductor device of claim 1, wherein:
said MOS capacitance element is formed on a substrate,
a first insulating film is formed on said MOS capacitance element,
said first and the second voltage-applying interconnections are formed on said first insulating film,
a second insulating film is formed on said first and the second voltage-applying interconnections, and
said signal-transmission interconnection is formed on said second insulating film.

5. A semiconductor device comprising:
a signal-transmission interconnection for transmitting signals;
a MOS capacitance element having a source, a drain, a well, and a gate electrode connected to said signal-transmission interconnection;
a first voltage-applying interconnection being connected to said source and said drain of said MOS capacitance element, and said first voltage-applying interconnection being configured to apply a voltage to said source and said drain of said MOS capacitance element;
a second voltage-applying interconnection being connected to said well of said MOS capacitance element, and said second voltage-applying interconnection being configured to apply a voltage to said well of said MOS capacitance element;
a ground interconnection;
a first capacitance element for connecting said ground interconnection and said first voltage-applying interconnection; and
a second capacitance element for connecting said ground interconnection and said second voltage-applying interconnection.

6. The semiconductor device of claim 5, wherein each of said first and said second capacitance elements is a MOS capacitance element.

7. The semiconductor device of claim 5, wherein each of said first and said second capacitance elements is a diode having p-type and n-type diffusion layers.

8. The semiconductor device of claim 5, wherein each of said first and said second capacitance elements includes a first conductive layer, an insulating film placed on said first conductive layer, and a second conductive layer placed on said insulating film.

9. The semiconductor device of claim 5, wherein:
said MOS capacitance element is formed on a substrate,
a first insulating film is formed on said MOS capacitance element,
said first and the second voltage-applying interconnections are formed on said first insulating film,
a second insulating film is formed on said first and the second voltage-applying interconnections, and
said signal-transmission interconnection and said ground interconnection are formed on said second insulating film.

10. A semiconductor device comprising:
a signal-transmission interconnection for transmitting signals;
a CMOS capacitance element including (i) a n-type MOS capacitance element having source, a drain, a well, and a gate electrode connected to said signal-transmission interconnection, and
(ii) a p-type MOS capacitance element having a source, a drain, a well, and a gate electrode connected to said signal-transmission interconnection;
a first voltage-applying interconnection being connected to said source and said drain of said n-type MOS capacitance element, and said first voltage-applying interconnection being configured to apply a voltage to said source and said drain of said n-type MOS capacitance element;
a second voltage-applying interconnection being connected to said well of said n-type MOS capacitance element, and said second voltage-applying interconnection being configured to apply a voltage to said well of said n-type MOS capacitance element;
a third voltage-applying interconnection being connected to said source and said drain of said p-type MOS capacitance element, and said third voltage-applying interconnection being configured to apply a voltage to said source and said drain of said p-type MOS capacitance element; and
a fourth voltage-applying interconnection being connected to said well of said p-type MOS capacitance element, and said fourth voltage-applying interconnection being configured to apply a voltage to said well of said p-type MOS capacitance element.

11. The semiconductor device of claim 10, wherein said second voltage-applying interconnection is a ground interconnection, said semiconductor device comprises a first capacitance element configured to connect said second voltage-applying interconnection and said first voltage-applying interconnection, a second capacitance element configured to connect for connecting said second voltage-applying interconnection and said third voltage-applying interconnection, and a third capacitance element configured to connect said second voltage-applying interconnection and said fourth voltage-applying interconnection.

12. The semiconductor device of claim 10, wherein said signal-transmission interconnection transmits digital signals.

13. The semiconductor device of claim 10, further comprising a voltage limiting circuit including (i) a first diode having an anode connected to said signal-transmission interconnection and a cathode connected to a first variable voltage source, and (ii) a second diode having a cathode connected to said signal-transmission interconnection and an anode connected to a second variable voltage source.

14. A semiconductor device comprising:
a signal-transmission interconnection for transmitting signals;
first and second MOS capacitance elements, each MOS capacitance element having a source, a drain, a well, and a gate electrode, said gate electrode for said first MOS capacitance element being connected at a different position from said gate electrode for said second MOS capacitance element in the line length direction of said signal-transmission interconnection, along said signal-transmission interconnection;
a first voltage-applying interconnection being connected to said source and said drain of said first MOS capacitance element, and said first voltage-applying interconnection being configured to a voltage to said source and said drain of said first MOS capacitance element;
a second voltage-applying interconnection being connected to said well of said first MOS capacitance element, and said second voltage-applying interconnection being configured to apply a voltage to said well of said first MOS capacitance element;

a third voltage-applying interconnection being connected to said source and said drain of said second MOS capacitance element, and said third voltage-applying interconnection being configured to apply a voltage to said source and said drain of said second MOS capacitance element; and a fourth voltage-applying interconnection being connected to said well of said second MOS capacitance element, and said fourth voltage-applying interconnection being configured to apply a voltage to said well of said second MOS capacitance element, wherein the voltages of said first, second, third and fourth voltage-applying interconnections are controlled independently from each other.

15. The semiconductor device of claim 14, wherein said signal-transmission interconnection transmits digital signals.

16. The semiconductor device of claim 14, further comprising a voltage limiting circuit including (i) a first diode having an anode connected to said signal-transmission interconnection and a cathode connected to a first variable voltage source, and (ii) a second diode having a cathode connected to said signal-transmission interconnection and an anode connected to a second variable voltage source.

17. A semiconductor device comprising:

a first signal-transmission interconnection for transmitting a first signal;

a second signal-transmission interconnection for transmitting a second signal, the second signal being an inverted signal of the first signal and said second signal-transmission interconnection being arranged substantially parallel to said first signal-transmission interconnection;

a first MOS capacitance element having a source, a drain, a well, and a gate electrode connected to said first signal-transmission interconnection;

a second MOS capacitance element having a source, a drain, a well, and a gate electrode connected to said second signal-transmission interconnection;

a first voltage-applying interconnection being connected to said source and said drain of said first MOS capacitance element, and said source and said drain of said second MOS capacitance element, and said first voltage-applying interconnection being configured to apply a voltage to said sources and said drains of said first MOS capacitance element and said second MOS capacitance element; and a second voltage-applying interconnection being connected to said well of said first MOS capacitance element and said well of said second MOS capacitance element, and said second voltage-applying interconnection being configured to apply a voltage to said well of said first MOS capacitance element and said well of said second MOS capacitance element.

18. A method for adjusting characteristics of a semiconductor device, the semiconductor device including, a signal-transmission interconnection for transmitting signals, a MOS capacitance element having a source, a drain, a well, and a gate electrode connected to the signal-transmission interconnection, a first voltage-applying interconnection being connected to the source and the drain of the MOS capacitance element, and the first voltage-applying interconnection being configured to apply a voltage to the source and the drain of the MOS capacitance element, and a second voltage-applying interconnection being connected to the well of the MOS capacitance element, and the second voltage-applying interconnection being configured to apply a voltage to the well of the MOS capacitance element, said method for adjusting characteristics of a semiconductor device comprising:

adjusting jitters occurring in the signal-transmission interconnection for transmitting signals by controlling voltages of each of the first voltage-applying interconnection and the second voltage-applying interconnection independently from each other.

* * * * *